United States Patent
Lee et al.

(10) Patent No.: US 7,995,655 B2
(45) Date of Patent: Aug. 9, 2011

(54) PIPELINED COEFFICIENT VARIABLE LENGTH CODING

(75) Inventors: Kyung-Koo Lee, Seongnam-si (KR); Jung-Sun Kang, Yongin-si (KR); Jin-Hyun Cho, Seongnam-si (KR); Tae-Hwan Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1730 days.

(21) Appl. No.: 11/187,908

(22) Filed: Jul. 22, 2005

(65) Prior Publication Data

US 2006/0018384 A1    Jan. 26, 2006

(30) Foreign Application Priority Data

Jul. 26, 2004 (KR) .................. 10-2004-0058134

(51) Int. Cl.
*H04N 7/18* (2006.01)

(52) U.S. Cl. ............................ 375/240.23; 375/240.26

(58) Field of Classification Search . 375/240.01–240.29
See application file for complete search history.

(56) References Cited

U.S. PATENT DOCUMENTS 6,334,180 B1 * 12/2001 Petrick ........................ 712/34

FOREIGN PATENT DOCUMENTS

| JP | 07-240844 | 9/1995 |
| JP | 10-191336 | 7/1998 |
| JP | 11-215009 | 8/1999 |
| JP | 2002-237754 | 8/2002 |
| JP | 2002-246914 | 8/2002 |
| JP | 2003-224851 | 8/2003 |

OTHER PUBLICATIONS

Japanese Office Action dated Dec. 21, 2010 in corresponding Japanese Patent Appln. No. 2005-204087.

* cited by examiner

*Primary Examiner* — Andy Rao

(74) *Attorney, Agent, or Firm* — F. Chau & Associates, LLC

(57) ABSTRACT

According to a coefficient variable length coding method adopting four-stage pipeline, a 3-dimension value including a run, a level and a last data is obtained by performing a run length coding upon coefficient data, where, after transferring the 3-dimension value, a variable bit vector is obtained from the transferred 3-dimension value and the variable length bit vector is stored, and where, particularly in case the pipeline breaks, the method reuses the previously obtained 3-dimension value to minimize process time such that the coefficient variable length coding is swiftly performed by the efficient pipeline operation, and the broken pipeline may be restored within minimized time.

15 Claims, 8 Drawing Sheets

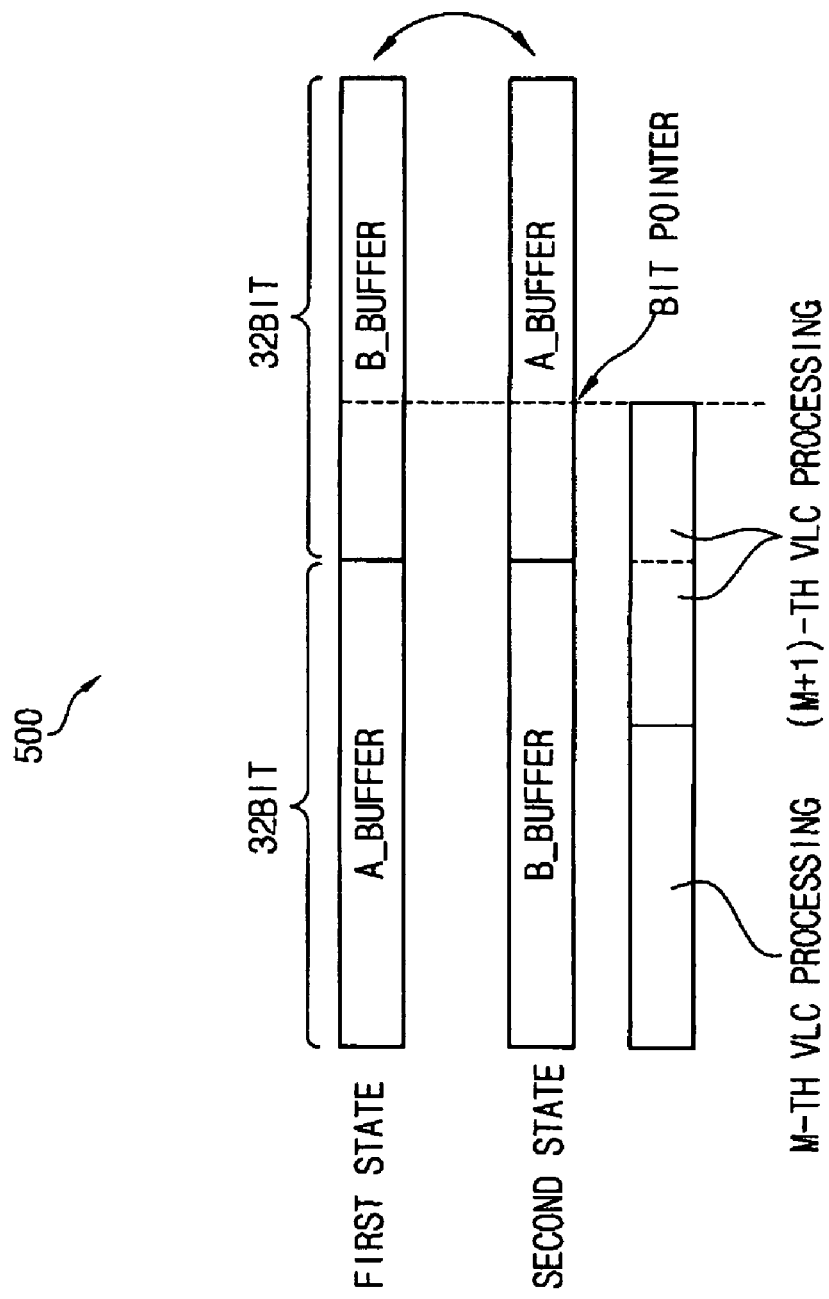

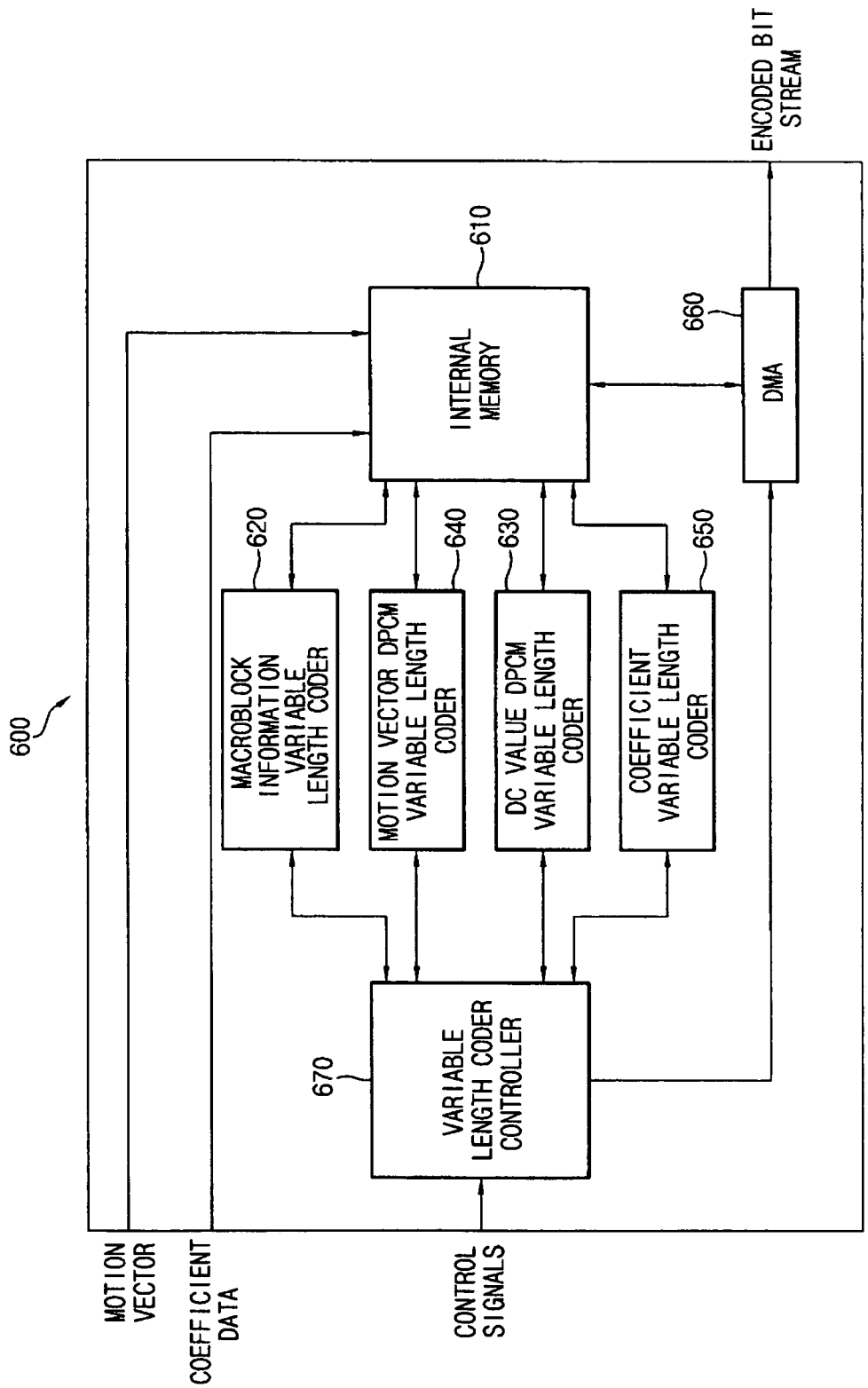

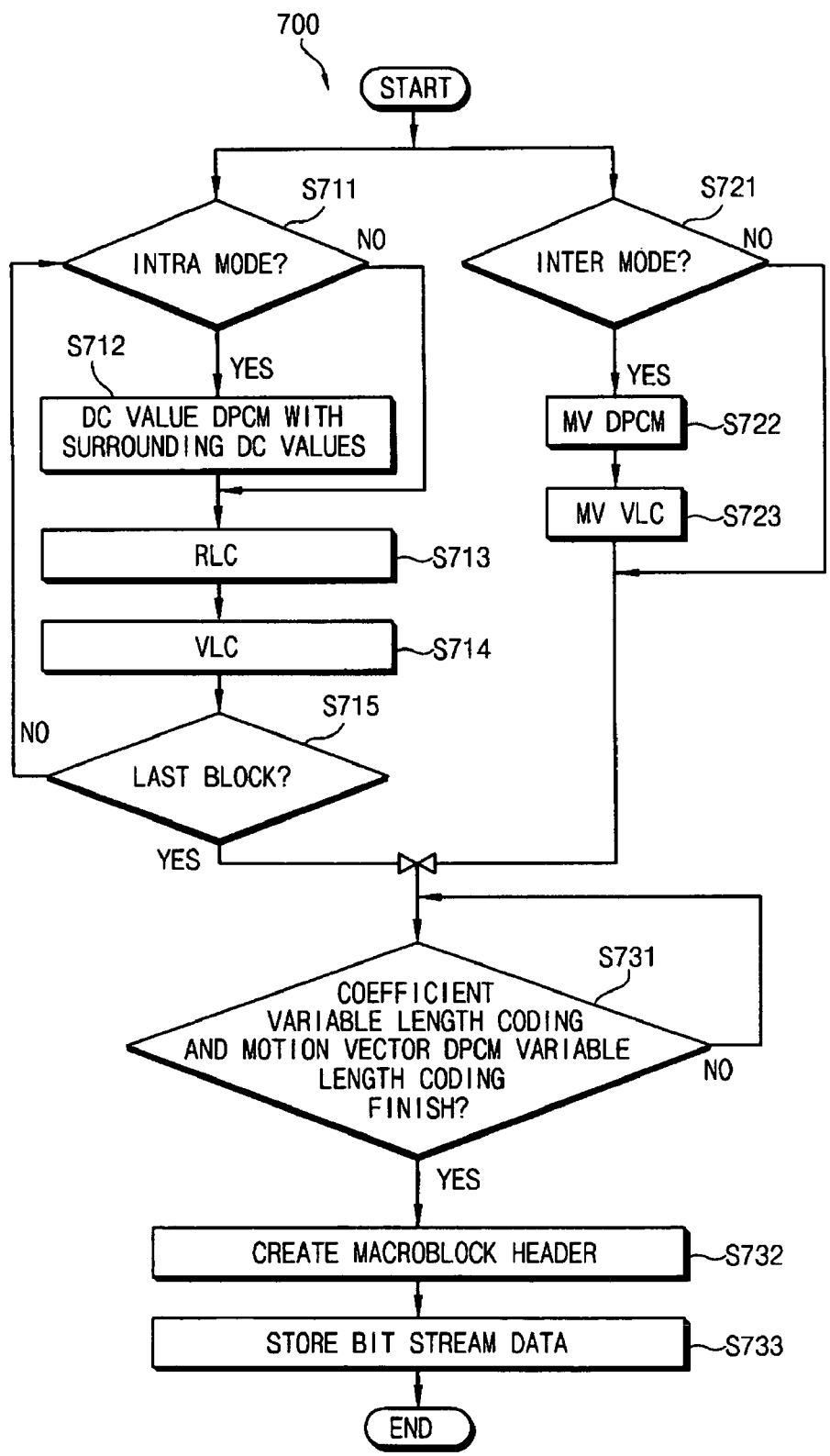

PIPELINED COEFFICIENT VARIABLE LENGTH CODING

CROSS-REFERENCE TO RELATED APPLICATION

This application claims the benefit under 35 U.S.C. §119(a) of Korean Patent Application No. 2004-0058134 filed on Jul. 26, 2004, the contents of which are herein incorporated by reference in their entirety.

BACKGROUND OF THE INVENTION

1. Field of the Invention

The present disclosure relates to variable length coding, and more particularly relates to coefficient variable length coding for video codecs.

2. Description of the Related Art

Portable devices such as mobile phones, digital cameras and camcorders process moving picture data having more pixels than in the past, and require higher computing power at equal power consumption, for example.

Generally a video codec includes processing units such as a motion estimator, a motion compensator, a discrete cosine converter, an inverse discrete cosine converter, a quantizer, an inverse quantizer, a variable length coder and a variable length decoder. Among the processing units, the variable length coder and the variable length decoder have a high dependency on input data, and are not easily implemented with efficient hardware configurations.

As the amount of moving picture data of recent multimedia devices increases, a real time video codec should process more data for a given time. The variable length coder needs to operate bit-by-bit and refer to many reference tables, such that high-speed hardware is required for the variable length coder.

Particularly, a coefficient variable length coder performs a run length coding upon coefficient data to obtain run data, level data and last data (hereinafter, collectively referred to as a "3-dimension value"), and refers to the reference tables to obtain a bit vector corresponding to the 3-dimension value. To compress the coefficient data, the run length coding method inspects data in units of 8×8 data blocks; obtains the run, level and last data; assigns proper variable bit vectors for the run, level, and last data; accumulates the variable bit vectors into a bit stream; and then stores the bit stream into a memory.

The run data represents an accumulative number of previous successive zeros before a non-zero value appears. The level data represents coefficients of the data block when a non-zero value appears. The last data represents the end of the 8×8 block. The above process is done by fetching the coefficient data from the memory, by referring to the reference tables, and by storing or by transferring the bit vectors to the memory or other devices. Thus, the process needs many clock cycles and inevitably requires a pipeline structure.

Depending upon the inputted 3-dimension value, there may be 'escape data' that cannot be handled by referring to general reference tables during the coefficient coding process. When the pipeline is broken by such escape data, restoration would consume much time because an address pointer needs to be turned backward in order to recover the 3-dimension value.

Current coefficient data as well as successive coefficient data is generally required in order to obtain the last data in the 3-dimension value, and thus many clock cycles may be wasted in order to recover the previous 3-dimension value because of the broken pipeline. Therefore, it is desirable to minimize the waste of clock cycles for performing the coding process at the occurrence of the escape data, which cannot be treated using the general reference tables, when the pipeline is broken.

SUMMARY OF THE INVENTION

An exemplary embodiment of the present disclosure provides a coefficient variable length coding method with a 4-stage pipeline capable of reducing the process time for restoring the pipeline when the pipeline is broken.

Another exemplary embodiment of the present disclosure provides a coefficient variable length coder with a 4-stage pipeline capable of reducing the process time for restoring the pipeline when the pipeline is broken.

In one exemplary embodiment, a coefficient variable length coding method with four-stage pipeline operations in parallel includes performing a run length coding upon coefficient data to obtain a first 3-dimension value including run data, level data and last data, during a first clock cycle, transferring the first 3-dimension value during a second clock cycle, obtaining a variable bit vector based on the transferred first 3-dimension value during a third clock cycle, and storing the variable bit vector during a fourth clock cycle.

In another exemplary embodiment, a coefficient variable length coder with four-stage pipeline operations includes a run length coder (RLC) configured to perform a run length coding upon coefficient data received from a memory to obtain a first 3-dimension value including run data, level data and last data during a first clock cycle, and configured to transferring the first 3-dimension value during a second clock cycle, and a variable length coder (VLC) configured to obtain a variable bit vector based on the transferred first 3-dimension value during a third clock cycle, and configured to store the variable bit vector during a fourth clock cycle.

In another exemplary embodiment, a variable length coder for a video codec with four-stage pipeline includes an internal memory for storing a motion vector and coefficient data; a macroblock information variable length coder configured to perform a variable length coding upon an information, and configured to transfer the coded information to the internal memory to be stored, the information including a macroblock type and a non-zero data existence; a Direct Current (DC) value Differential Pulse Code Modulation (DPCM) coder configured to receive a first DC value of a first block from the internal memory, configured to perform a DPCM coding upon DC value differences between the first DC value and second DC values of second blocks surrounding the first block, and configured to transfer the DPCM coded result to the internal memory to be stored; a motion vector DPCM variable coder configured to receive motion vectors from the internal memory to perform a first variable length coding upon motion vector differences, and configured to transfer the variable length coded result to the internal memory to be stored; a coefficient variable length coder configured to receive the coefficient data from the internal memory, configured to perform a coefficient variable length coding upon the coefficient data, and configured to store the coefficient variable length coded data in the internal memory; a Direct Memory Access (DMA) configured to transfer the coded data stored in the internal memory to an external memory; and a variable length coder controller configured to control the macroblock information variable length coder, the DC value DPCM coder, the motion vector DPCM variable length coder, the coefficient variable length coder and the DMA based on control signals; wherein the coefficient variable length coder includes a run length coder (RLC) configured to perform the run length coding upon the coefficient data received from the internal memory to obtain a first 3-dimension value including run data, level data and last data during a first clock cycle, and configured to transferring the first 3-dimension value during a second clock cycle; and a variable length coder (VLC) configured to obtain a variable bit vector based on the transferred first 3-dimension value during a third clock cycle, and configured to store the variable bit vector during a fourth clock cycle.

BRIEF DESCRIPTION OF THE DRAWINGS

The above and other features and advantages of the present disclosure will become more apparent by describing in detail exemplary embodiments thereof with reference to the accompanying drawings, in which:

FIG. 5 is a block diagram illustrating a pingpong buffer of the VLC in FIG. 1;

FIG. 6 is a block diagram illustrating a variable length coder having the coefficient variable length coder in FIG. 1; and FIG. 7 is a flow chart for the variable length coder in FIG. 6.

DETAILED DESCRIPTION OF PREFERRED EMBODIMENTS

Figure 1:
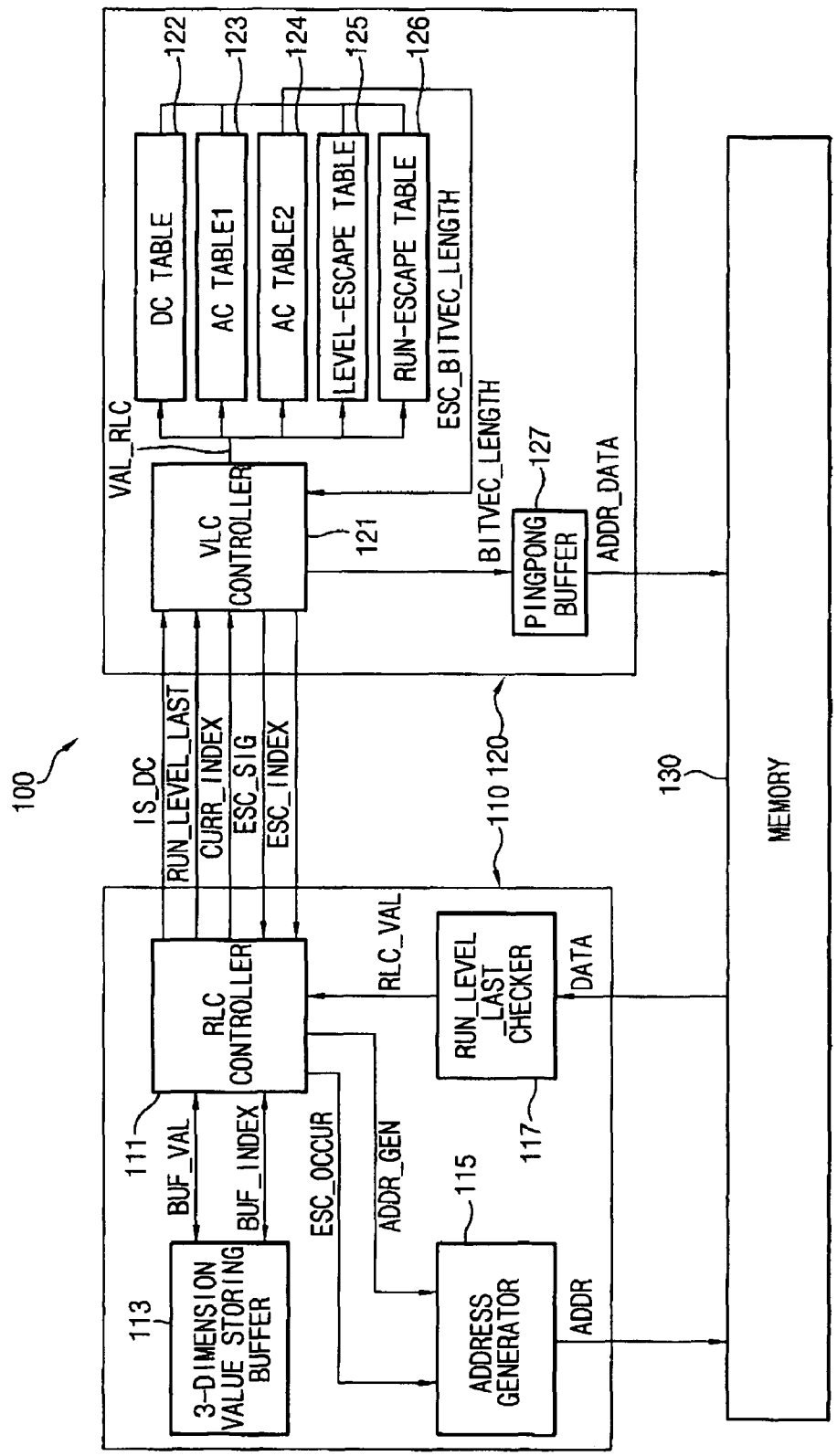
FIG. 1 is a block diagram illustrating a coefficient variable length coder according to an exemplary embodiment of the present disclosure.

Detailed illustrative embodiments of the present disclosure are disclosed herein. Specific structural and functional details disclosed herein are merely representative for purposes of describing exemplary embodiments of the present disclosure. This invention may, however, be embodied in many alternate forms and should not be construed as limited to the embodiments set forth herein.

Accordingly, while the present disclosure is susceptible to various modifications and alternative forms, specific embodiments thereof are shown by way of example in the drawings and will herein be described in detail. It should be understood, however, that there is no intent to limit the present invention to the particular forms disclosed, but on the contrary, the present invention is to cover all modifications, equivalents, and alternatives falling within the spirit and scope of the present disclosure as defined by the claims. Like reference numerals may be used to refer to like elements.

It should also be noted that in some alternative implementations, the functions/acts noted in the blocks might occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram illustrating a coefficient variable length coder, indicated generally by the reference numeral 100, according to an exemplary embodiment of the present disclosure.

Referring to FIG. 1, the coefficient variable length coder 100 includes a Run Length Coder (RLC) 110, a Variable Length Coder (VLC) 120 and a memory 130.

The RLC 110 receives coefficient data from the memory 130 and performs a run-length coding upon the coefficient data to generate a 3-dimension value, and transfers the 3-dimension value together with an index to the VLC 120. The 3-dimension value includes run data, level data and last data.

The RLC 110 particularly includes a 3-dimension value storing buffer 113 for storing the 3-dimension value, which is transferred to the VLC 120 with the corresponding index during given clock cycles.

For example, the 3-dimension value storing buffer 113 may store up to four 3-dimension values. In other words, the 3-dimension value storing buffer 113 may store the 3-dimension values for four clock cycles. This is because the RLC 110 requires about four clock cycles to treat an escape of the 3-dimension value. During the four-clock cycle, the RLC 110 obtains the 3-dimension value to transfer the obtained 3-dimension value to the VLC 120, and the VLC 120 generates an escape signal when the VLC 120 cannot find the 3-dimension value within the general reference tables, i.e., AC TABLE1 and AC TABLE2.

When the VLC 120 cannot find the 3-dimension value within the general reference tables so that the escape occurs and the pipeline breaks, the RLC 110 doesn't repeat the run-length coding on the obtained 3-dimension value, but reuses the 3-dimension value which is previously stored in the 3-dimension value storing buffer 113 while the VLC 120 treats the escape.

The RLC 110 shown in FIG. 1 includes the 3-dimension value storing buffer 113, a RLC controller 111, an address generator 115 and a run-level-last checker 117.

The RLC controller 111 provides an address generation signal ADDR_GEN to the address generator 115 when the run length coding process begins. The address generator generates an address ADDR indicating coefficient data to be read from the memory 130. The memory 130 outputs the coefficient data corresponding to the address ADDR to the run-level-last checker 117. The run-level-last checker 117 generates the 3-dimension value RLC_VAL when the coefficient data are non-zero, and transfers the 3-dimension value RLC_VAL to the RLC controller 111.

The RLC controller 111 receives the 3-dimension value from the run-level-last checker 117 and decides whether the 3-dimension value RLC_VAL is a Direct Current (DC) component. When the 3-dimension value RLC_VAL is a DC component, the RLC controller 111 activates a DC signal IS_DC and transfers the 3-dimension value RLC_VAL to the VLC 120 through a signal path RUN_LEVEL_LAST. When the 3-dimension value RLC_VAL is not a DC component, the RLC controller 111 deactivates the DC signal IS_DC and transfers the 3-dimension value RLC_VAL to the VLC 120 through the signal path RUN_LEVEL_LAST. An index is also transferred together through a signal path CURR_INDEX. The index may have a value in a range from 1 to 4, which represents a location of the 3-dimension value storing buffer 113 that stores up to four 3-dimension values RLC_VAL. The RLC controller 111 stores the 3-dimension value in the 3-dimension value storing buffer 113 to read the 3-dimension value through a signal path BUF_VAL, and stores the index in the 3-dimension value storing buffer 113 to read the index through a signal path BUF_INDEX.

Therefore, The RLC 110 in FIG. 1 repeatedly generates the memory address ADDR every clock, and produces the 3-dimension value corresponding to a non-zero coefficient to output the produced 3-dimension value together with the index. Whenever the 3-dimension value is produced, the RLC 110 stores the 3-dimension value in the location of the 3-dimension value storing buffer 113.

The location of the 3-dimension value storing buffer 113 corresponds to the index.

Hereinafter, operation of the RLC 110 will be illustrated in case the escape signal ESC_SIG occurs in the VLC 120.

When the escape signal ESC_SIG occurs, the RLC controller 111 checks whether another 3-dimension value is stored after the 3-dimension value that caused the escape signal in the 3-dimension value storing buffer 113 by comparing the escape index ESC_INDEX with a current index stored in the 3-dimension value storing buffer 113. When the escape index is equal to the current index, it indicates that no 3-dimension value is stored after the 3-dimension value causing the escape signal ESC_SIG. Otherwise, the escape index, which is not equal to the current index, indicates that some 3-dimension values are possibly stored after the 3-dimension value that caused the escape signal ESC_SIG.

When the escape index is larger than the current index, 3-dimension values from a 3-dimension value corresponding to an index (i.e. current index+1) through a 3-dimension value corresponding to the escape index are again transferred from the RLC 110 to the VLC 120 after the escape operation is processed.

When the escape index is smaller than the current index, 3-dimension values from a 3-dimension value corresponding to the index (i.e. current index+1) through a 3-dimension value corresponding to the index 4, are transferred, and then the 3-dimension values from a 3-dimension value corresponding to the index 1 through the 3-dimension value corresponding to the escape index are transferred.

The RLC controller 111 informs the address generator 115 of the escape occurring through a signal path ESC_OCCUR, which indicates the escape occurring. When there are some 3-dimension values, which are stored into the 3-dimension value storing buffer 113 after the 3-dimension value causing the escape signal ESC_SIG, the RLC controller 111 transfers these 3-dimension values to the VLC 120 every clock cycle after the escape signal is deactivated. The RLC controller 111 transfers the last 3-dimension value stored in the 3-dimension value storing buffer 113 to the VLC 120, and simultaneously produces a new address generation signal ADDR_GEN, to thereby restart reading the coefficient data.

The VLC 120 receives the DC signal IS_DC, the run-level-last signal RUN_LEVEL_LAST, and the current index signal CURR_INDEX from the RLC 110. When the 3-dimension value is received through the run-level-last signal RUN_LEVEL_LAST, the VLC 120 checks whether the 3-dimension value is a DC value based on the DC signal IS_DC. When the 3-dimension value is a DC value, the VLC 120 refers to a DC table 122 and stores a bit vector corresponding to the received 3-dimension value into the memory. Otherwise, the VLC 120 refers to an AC table1 123 or an AC table2 124 and stores a variable bit vector corresponding to the received 3-dimension value into a pingpong buffer 127. The VLC controller 121 in the VLC 120 searches the reference tables (e.g., the AC tables) for the 3-dimension value using a search signal VAL_RLC. When the 3-dimension value fails to be found in the AC table1 123 and the AC table2 124 and then an escape occurs, the VLC controller 121 produces the escape signal ESC_SIG, and in the next clock cycle, performs a level escape process using a level-escape table 125. When the level escape process is properly performed, the VLC controller 121 transfers the corresponding bit vector to the pingpong buffer 127, and deactivates the escape signal ESC_SIG. However, when the level escape process is not properly performed, the VLC controller 121 performs a run-escape process using a run-escape table 126, and keeps the escape signal ESC_SIG activated.

When the run-escape process is properly performed, the VLC controller 121 transfers the corresponding bit vector to the pingpong buffer 127, and deactivates the escape signal ESC_SIG. However, when the run-escape process is not properly performed, the VLC controller 121 performs a fixed bit coding, keeping the escape signal activated. After the fixed bit coding is finished, the VLC controller 121 deactivates the escape signal ESC_SIG. An output signal ESC_BITVAL_LENGTH, which is generated after searching the reference tables, may include information that represents whether the escape occurs, the bit vector, the length of the bit vector, and the like.

After receiving the bit vector from the reference tables, the VLC controller 121 outputs a bit vector signal BITVEC_LENGTH to the pingpong buffer 127 in order to store the bit vector in the pingpong buffer 127. The bit vector signal BITVECT_LENGTH may include the bit vector as well as the bit vector length, etc.

The pingpong buffer 127 accumulates the received bit vectors, and outputs storing signal ADDR_DATA in order to store the bit vectors in the memory 130 in a unit a given number of bits. The storing signal ADDR_DATA may include an address and a bit stream to be stored. The pingpong buffer 127 functions efficiently as a buffer between the VLC 120 and the memory 130 by increasing the address of the memory 130 in a unit of the given number of bits. The pingpong buffer 127 will be described below in detail.

Figure 2:
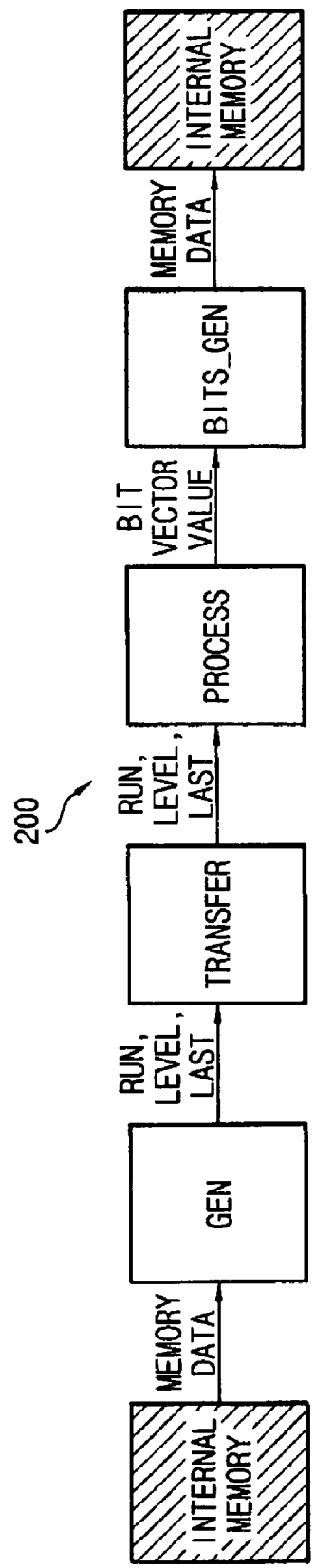
FIG. 2 is a block diagram illustrating a four-stage pipeline structure for the coefficient variable length coder in FIG. 1 according to another exemplary embodiment of the present disclosure.

FIG. 2 is a block diagram illustrating a four-stage pipeline structure for the coefficient variable length coder in FIG. 1 according to embodiments of the present disclosure.

Referring to FIG. 2, the coefficient variable length coder 100 of FIG. 1 performs four-stage pipeline operations, indicated generally by the reference numeral 200. The four-stage pipeline operations 200 include a stage GEN for obtaining a 3-dimension value, a stage TRANSFER for transferring the obtained 3-dimension value, a stage PROCESS for obtaining a variable bit vector by using the transferred 3-dimension value, and a stage BITS_GEN for storing the variable bit vector into the memory.

In order to perform the pipeline operation, the coefficient variable length coder 100 in FIG. 1 may read the coefficient data from an internal memory and store a variable bit stream into the internal memory during one clock cycle. Obtaining a variable bit vector by referring to reference tables corresponding to the 3-dimension value requires much time. For example, the reference table may be implemented as logic gate type tables so as to process within one clock cycle. The logic gate type tables are implemented by logic circuits. For example, the logic gate type tables may include an MPEG-4 intra coefficient table, an MPEG-4 inter coefficient table, a run-escape table and a level-escape table. Therefore, after receiving the 3-dimension value, the bit vector corresponding to the 3-dimension value would be available in just one clock cycle.

Figure 3A:
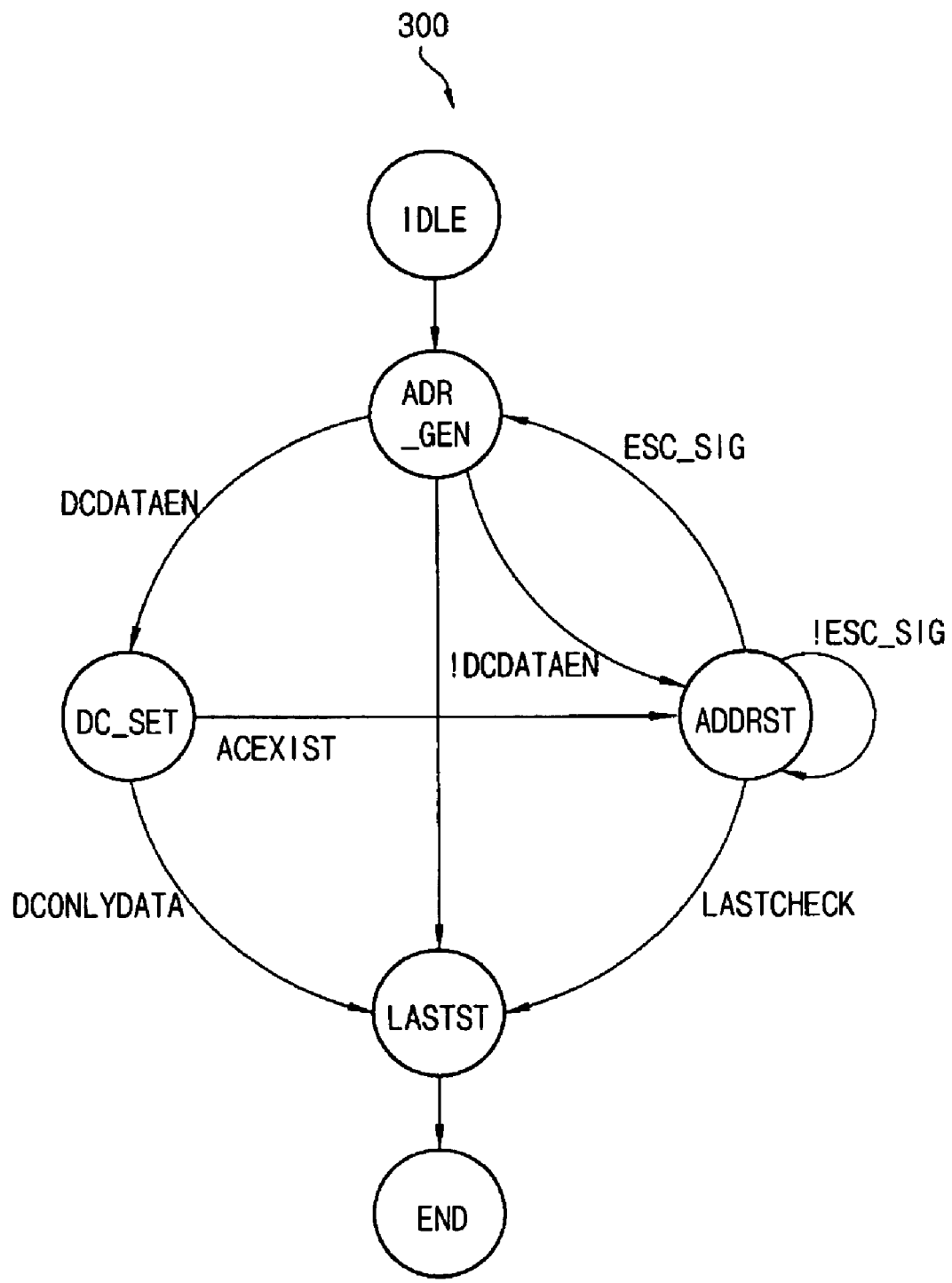
FIG. 3A is a state transition diagram illustrating an RLC in FIG. 1.

FIG. 3A is a state transition diagram illustrating an RLC 110 of FIG. 1, indicated generally by the reference numeral 300.

Referring to FIG. 3A, the RLC 110 in FIG. 1 starts a run length coding operation at an idle state IDLE and shifts to an address generating state ADR_GEN, in which the RLC 110 assigns a memory address and reads coefficient data from an internal memory. In the case that the coefficient data includes a DC coefficient, the RLC 110 shifts to a DC transferring state DC_SET in order to process the DC coefficient differently with other coefficients. In the case that the coefficient data includes no DC coefficients, or only AC coefficients remain in the coefficient data due to transferring the DC coefficient, the RLC 110 shifts to an AC transferring state ADDRST, in which the RLC 110 obtains a new 3-dimension value, transfers the new 3-dimension value to the VLC 120, and then stores the new 3-dimension value in a memory address corresponding to the index during given clock cycles.

In the AC transferring state ADDRST, the RLC 110 repeatedly obtains a 3-dimension value, transfers the 3-dimension value to the VLC 120 with index, and then generates the next internal memory address. Since the pipeline would not break until an escape occurs, the RLC 110 is capable of performing a high speed variable length coding. When an activated escape signal ESC_SIG is received from the VLC 120 during the AC transferring state ADDRST, the RLC 110 shifts back to the address generating state ADR_GEN, in which the RLC 110 transfers again the 3-dimension values previously stored after the 3-dimension value corresponding to the escape index when the escape signal ESC_SIG is deactivated.

When no AC coefficient remains after transferring the DC coefficient to the VLC 120 in the DC transferring state DC_SET, or all coefficients are transferred to the VLC 120, the RLC 110 shifts to a last state LASTST and then the run length coding operation finishes.

Next, signals in FIG. 3A are illustrated. A DCDATAEN signal indicates that the coefficient data contains a DC coefficient. A DCONLYDATA signal indicates that the coefficient data containing a DC coefficient include only the DC coefficient and no AC coefficient. An ACEXIT indicates that the coefficient data containing a DC coefficient includes AC coefficients. The ESC_SIG signal indicates that an escape occurs in VLC 120. A LASTCHECK signal indicates that the RLC process finishes. The ESC_SIG is provided externally, but other signals are generated and used in the RLC 120.

Figure 3B:
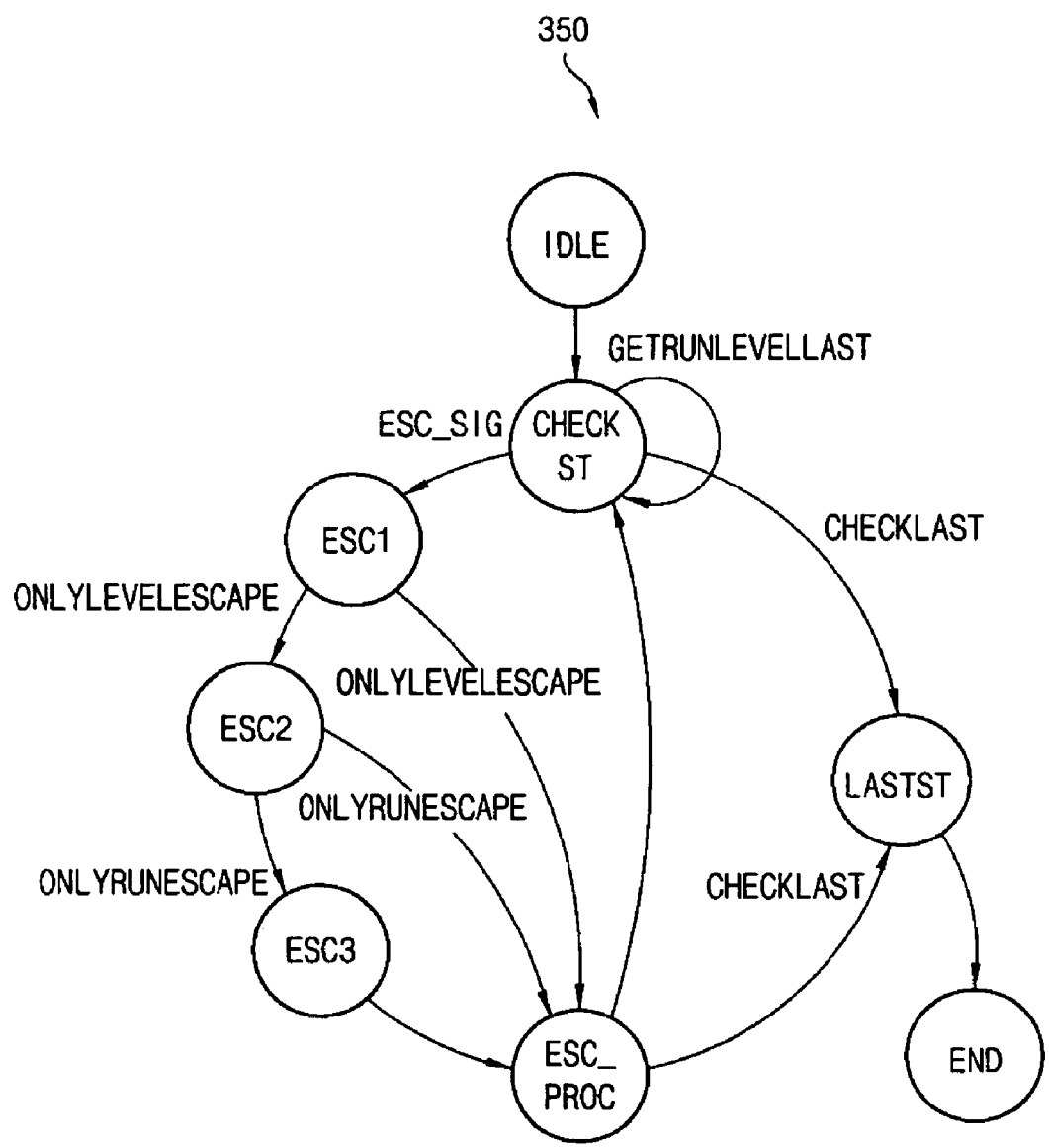
FIG. 3B is a state transition diagram illustrating a VLC in FIG. 1.

FIG. 3B is a state transition diagram illustrating a VLC 120 of FIG. 1, indicated generally by the reference numeral 350.

Referring to FIG. 3B, the VLC 120 in FIG. 1 starts a variable length coding operation at an idle state IDLE and shifts to a checking state CHECKST, in which the VLC 120 receives the 3-dimension value and the index from the RLC 110 together, refers to the reference tables to search for a variable bit vector corresponding to the 3-dimension value, and then stores the variable bit vector in a memory.

In case an escape occurs that cannot be processed through the general reference tables, the VLC 120 activates the escape signal ESC_SIG, shifts to a first escape state ESC1, and performs a level escape process upon level data. When the level escape process in the first escape state ESC1 fails, the VLC 120 shifts to a second escape state ESC2, and performs a RUN escape process upon RUN data. When the RUN escape process in the second escape state ESC2 fails, the VLC 120 shifts to a third escape state ESC3, and performs a fixed bit coding. When the escape process succeeds in either the first escape state ESC1 or the second escape state ESC2, or when the fixed bit coding is finished in the third escape state ESC3, then the VLC 120 deactivates the escape signal ESC_SIG and shifts to an escape process finish state ESC_PROC for storing an obtained bit vector.

After storing the bit vector during the escape process finish state ESC_PROC, the VLC 120 shifts to the check state CHECKST. However, when the LAST data are equal to 1, the VLC 120 shifts to a finish state LASTST, and then the variable length coding operation finishes.

When the VLC 120 enters into the first escape state ESC1, the VLC 120 informs the RLC 110 that additional clock cycles are needed by sending the escape signal ESC_SIG so that the RLC 110 shifts to the address generating state ADR_GEN. At the same time, the VLC 120 informs the RLC 110 of an index at which the escape occurs, by sending the escape index ESC_INDEX, so that the RLC 110 does not perform the run-length coding again on the 3-dimension values that are obtained when the RLC 110 performs the escape operation, but transfers previously stored 3-dimension value to the VLC 120. In this manner, clock cycle waste may be minimized when the pipeline is broken. Because the RLC 110 is in the address generating state ADR_GEN, the pipeline process starts again.

Next, the signals in FIG. 3B are illustrated. A GETRUNLEVELLAST signal indicates that the VLC 120 repeatedly receives data from the RLC 110. The ESC_SIG signal indicates that the VLC 120 cannot find the received 3-dimension data in the general reference tables, or that the escape occurs. The ESC_SIG signal is also transferred to the RLC 110, and the RLC 110 waits until the escape state ends in response to the ESC_SIG signal. An ONLYLEVELESCAPE signal indicates that the escape state is a level escape. An ONLYRUNESCAPE signal indicates that the escape state is a run escape. A CHECKLAST signal indicates that the last data signal in the received 3-dimension value is equal to 1. The ESC_SIG signal is provided externally, but other signals are generated and used in the VLC.

Figure 4:
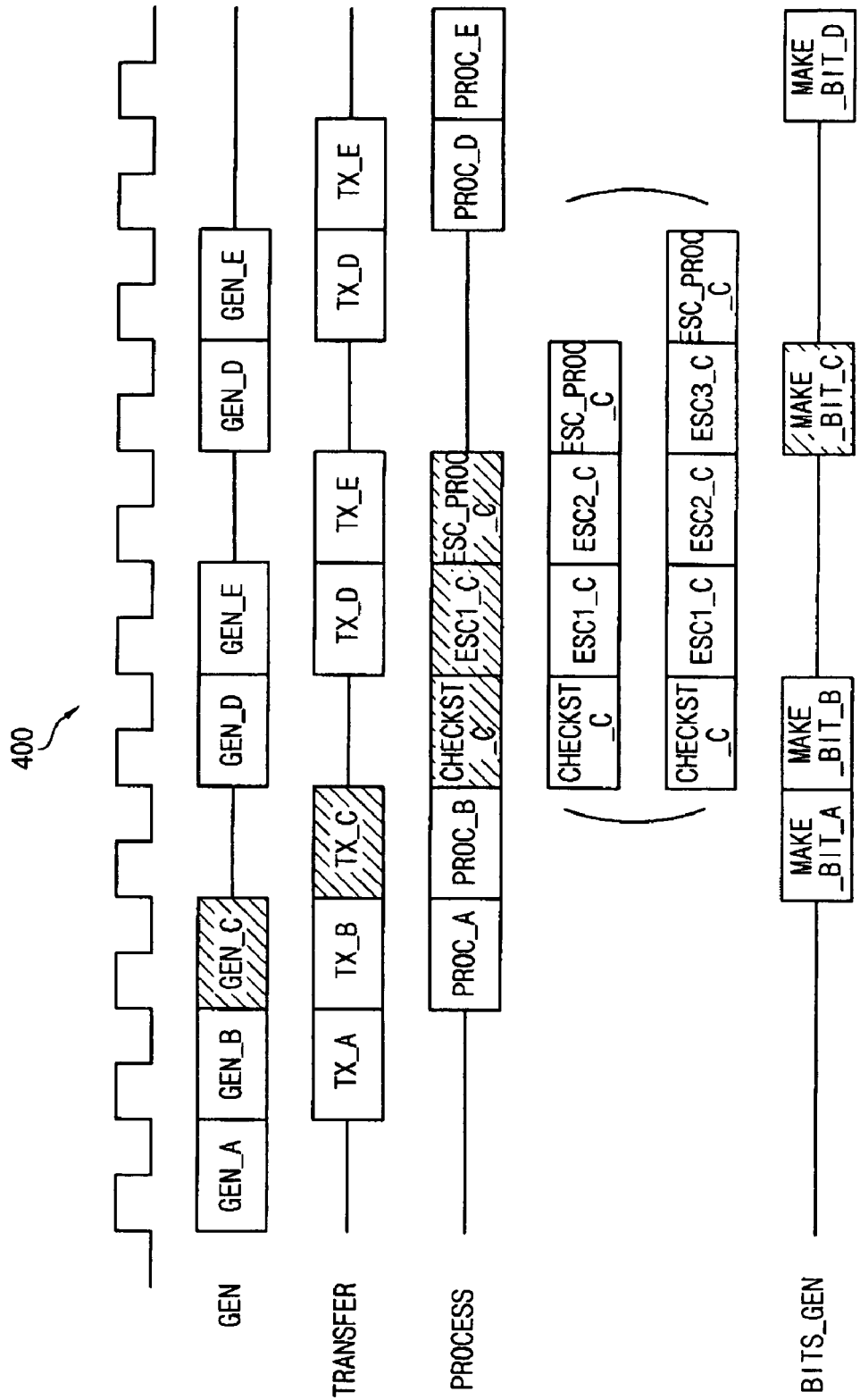
FIG. 4 is a timing diagram illustrating pipeline operations of the coefficient variable length coder in FIG. 1 according to an exemplary embodiment of the present disclosure.

FIG. 4 is a timing diagram illustrating pipeline operations of the coefficient variable length coder 100 of FIG. 1, indicated generally by the reference numeral 400, according to an exemplary embodiment of the present disclosure.

Referring to FIG. 4, a vertical axis of the timing diagram in FIG. 4 indicates each stage of the four-stage pipeline operation. Accordingly, FIG. 4 illustrates successive coding operations of the four-stage pipeline operations, which include a stage GEN for obtaining the 3-dimension value, a stage TRANSFER for transferring the obtained 3-dimension value, a stage PROCESS for obtaining a variable bit vector by using the transferred 3-dimension value, and a stage BITS_GEN for storing the bit vectors as a bit stream into the internal memory.

In the stage GEN, the coefficient variable length coder obtains successively first 3-dimension value (step GEN_A), second 3-dimension value (step GEN_B) and a third 3-dimension value (step GEN_C), and after passing one clock cycle, the coefficient variable length coder obtains successively a fourth 3-dimension value (step GEN_D) and a fifth 3-dimension value (step GEN_E). When the coefficient data have all zeros, one clock cycle is passed and thus the 3-dimension value may not be obtained every clock cycle as shown in FIG. 4.

After the first 3-dimension value is obtained in the step GEN_A of the stage GEN, the transferring stage TRANSFER follows. Accordingly, the transferring stage TRANSFER comes one clock later after the corresponding the stage GEN.

When the pipeline does not break, the stage PROCESS comes one clock later after the transferring stage TRANSFER. Accordingly, a step PROC_A and a step PROC_B, in which variable bit vectors are obtained with respect to the first and the second 3-dimension values, are performed at one clock later after transferring steps TX_A and TX_B, respectively. The stage BITS_GEN, in which the variable bit vectors are stored as bit stream into the internal memory, comes one clock later after the stage PROCESS. Accordingly, a step MAKE_BIT_A and a step MAKE_BIT_B, in which the variable bit vectors are stored in the internal memory, are performed at one clock later after the step PROC_A and the step PROC_B.

The third 3-dimension value of the step GEN_C in FIG. 4 represents the occurrence of the escape. When the escape is a level escape, it takes 3 clock cycles to obtain the bit vector, that is, one clock cycle for determining whether the 3-dimension value is not found on the general reference tables, another clock cycle for performing the level escape process upon the level data, and another clock cycle for generating the bit vector. Each of the 3 clocks may match the check state CHECKST, the first escape state ESC1 and the escape process finish state ESC_PROC of the state transition diagram in FIG. 3B, respectively. Accordingly, after 3 clock cycles during which the bit vector corresponding to the level escape is generated, the fourth 3-dimension value of the step GEN_D in the stage GEN is transferred through the step TX_D, once again.

According to this exemplary embodiment of the present disclosure, when the fourth 3-dimension value of the step GEN_D is transferred, the coefficient variable length coder does not perform the run-length coding so as to get the fourth 3-dimension value, but reuses the previously stored fourth 3-dimension value. While the escape operation of the third 3-dimension value is processed, two 3-dimension values are obtained (step GEN_D and GEN_E). These two 3-dimension values are reused as the previously stored 3-dimension values after the escape operation of the third 3-dimension value. The pipeline processes operationally start again after the two 3-dimension values are retransferred (step TX_D and step TX_E).

As shown in the large parentheses in FIG. 4, the run data escape operation of the run data requires one more clock than the level escape operation of the level data, and the fixed bit coding requires one more clock than the run data escape of the run data. This is because, as shown in the state transition diagram 350 in FIG. 3B, the run data escape operation passes via one more state, that is, the second escape state ESC2, and the fixed bit coding passes via two more states, that is, the second and the third escape states ESC2 and ESC3. Therefore, in cases of the run data escape or the fixed bit coding, the stage GEN starts again after the bit vector is obtained.

FIG. 5 is a block diagram illustrating a pingpong buffer 127 from the VLC of FIG. 1, indicated generally by the reference numeral 500. The VLC 120 has the pingpong buffer 127 in which the bit vectors are accumulated in order to store the accumulated bit vectors in the internal memory in a unit of a given number of bits.

Referring to FIG. 5, the pingpong buffer may include two 32-bit buffers. The bit vectors are stored in the left 32-bit buffer at first, and then in the right 32-bit buffer of the pingpong buffer in FIG. 5. As the coding process of the VLC 120 progresses, the bit vectors are accumulated as a bit stream in the pingpong buffer. The bit vectors are filled in the left 32-bit buffer. Then, when the left 32-bit buffer is full of the bit vectors, the bit vectors are continuously accumulated in the right 32-bit buffer, and the 32-bit stream stored in the left 32-bit buffer is transferred to the internal memory. In the same manner, after the right 32-bit buffer becomes full of the bit vectors, the bit vectors are continuously accumulated in the left 32-bit buffer, and the 32-bit stream stored in the right 32-bit buffer is transferred to the internal memory.

By repeating the above processes, the pingpong buffer may create the 32-bit stream and transfer the 32-bit stream to the internal memory without additional clock cycles. A bit pointer, which indicates a location where a current bit is accumulated in the pingpong buffer, and a memory address at which the bit stream is stored in the internal memory, may be controllably designed so that the pingpong buffer may generate the bit stream without additional bit duplication or bit relocation.

FIG. 6 is a block diagram illustrating a variable length coder having the coefficient variable length coder 100 of FIG. 1, indicated generally by the reference numeral 600.

Referring to FIG. 6, the variable length coder includes an internal memory 610, a macroblock information variable length coder 620, a DC value Differential Pulse Code Modulation (DPCM) coder 630, a motion vector DPCM variable length coder 640, a coefficient variable length coder 650, a Direct Memory Access (DMA) 660 and a variable length coder controller 670.

The internal memory 610 receives a motion vector, the coefficient data, etc. to store the motion vector and the coefficient data, etc. The macroblock information variable length coder 620 performs the variable length coding upon information indicating a macroblock type, non-zero data existence, etc., and then transfers the variable length coded result to the internal memory 610. The non-zero data existence indicates whether non-zero data exist.

The DC value DPCM coder 630 receives the first DC value of a first block from the internal memory 610, then performs a DPCM coding upon the difference between the first DC values of the first block and the second DC values of the second blocks surrounding the first block, and then transfers the DPCM coded result to the internal memory 610. The motion vector DPCM variable coder 640 receives, from the internal memory 610, the motion vector representing a motion which is obtained by comparing similarities between a first block and second blocks surrounding the first block in a unit of a macroblock or a subblock of the macroblock, and then performs a differential coding upon the difference between the motion vectors of the first block and the motion vectors of the second blocks surrounding the first block, to thereby transfer the variable length coded result to the internal memory 610.

The coefficient variable length coder 650 receives the coefficient data from the internal memory 610, performs a variable length coding upon the coefficient data to obtain a bit stream, and then stores the bit stream in the internal memory 610. The coefficient variable length coder 650 may adopt the coefficient variable length coder in FIG. 1, which performs the four-stage pipeline operations and reduces the time for restoring the broken pipeline by reusing the previously obtained 3-dimension value when an escape occurs.

The DMA 660 sends the data in the internal memory 610 to the external memory (not shown). The variable length coder controller 670 receives control signals, and controls the macroblock information variable length coder 620, the DC value DPCM coder 630, the motion vector DPCM variable length coder 640, the coefficient variable length coder 650, and the DMA 660 based on the control signals.

FIG. 7 is a flow chart for the variable length coder 600 of FIG. 6, indicated generally by the reference numeral 700.

Referring to FIG. 7, the variable length coder in FIG. 6 performs the motion vector DPCM variable length coding process in parallel with the coefficient variable length coding process.

The motion vector DPCM variable length coding process determines whether the block is an inter mode at step S721. In case of the inter mode, the motion vector DPCM process is performed at step S722, and then the variable length coding process is performed at step S723. The variable length coder in FIG. 6 performs the motion vector DPCM variable length coding process as well as the coefficient variable length coding process simultaneously.

The coefficient coding process begins with determining whether the block is an intra mode at step S711. In case of the intra mode, the DC value DPCM process is performed upon the surrounding DC values at step S712, then the run-length coding at step S713 and the variable length coding at step S714 are performed successively. When the image is not in the intra mode, the run-length coding at step S713 and the variable length coding at step S714 are directly performed successively. Next, the coefficient coding process determines whether the coded block is the last block of the macroblock. When the coded block is not the last block, the coefficient coding process jumps to the step S711, but otherwise jumps to a step S731.

The variable length coder determines whether the coefficient variable length coding process and the motion vector DPCM variable length coding process finish at step S731. Then, a macroblock header is created at step S732 and the bit stream data are stored at step S733.

As described above, the coefficient variable length coding method and the coefficient variable length coder according to the exemplary embodiments of the present disclosure adopt the four-stage pipeline operations. Therefore, the variable bit vector is created every clock cycle, to thereby increase the speed of the coefficient variable length coding process. When an escape occurs and the pipeline operation breaks, the coefficient variable length coder does not perform the run length coding, but stores the 3-dimension value, which is created while the escape is processed, into a buffer to retransfer the previously stored 3-dimension values so that the process time for restoring the pipeline may be reduced. Therefore, the variable length coding for high resolution moving picture data may be efficiently performed.

While the exemplary embodiments of the present disclosure and corresponding advantages have been described in detail, it shall be understood that various changes, substitutions and alterations can be made herein without departing from the scope of the present invention as defined by appended claims.

What is claimed is:

1. A coefficient variable length coding method that includes four-stage pipeline operations in parallel, comprising:
    performing a run length coding upon coefficient data to obtain a first 3-dimension value including run data, level data and last data, during a first clock cycle;
    transferring the first 3-dimension value during a second clock cycle;
    obtaining a variable bit vector based on the transferred first 3-dimension value during a third clock cycle; storing the variable bit vector during a fourth clock cycle;
    wherein the transferring the first 3-dimension value comprises:
    transferring an index corresponding to the first 3-dimension value; and storing the first 3-dimension value and the index for given clock cycles, and wherein the obtaining a variable bit vector comprises:
    reusing the stored first 3-dimension value with the corresponding index to obtain the variable bit vector instead of performing the run length coding upon second 3-dimension values when an escape occurs, the second 3-dimension values being obtained while an escape operation is processed, and the escape operation being processed when the transferred first 3-dimension value is not found in a general reference table.

2. The method of claim 1, wherein the given clock cycles corresponds to 4 clock cycles.

3. The method of claim 2, wherein the coefficient variable length coding method further comprises repeating the four-stage pipeline operations after transferring the second 3-dimension values.

4. A coefficient variable length coder for performing four-stage pipeline operations, comprising:
    a run length coder (RLC) configured to perform a run length coding upon coefficient data received from a memory to obtain a first 3-dimension value including run data, level data and last data during a first clock cycle, and configured to transferring the first 3-dimension value during a second clock cycle;
    a variable length coder (VLC) configured to obtain a variable bit vector based on the transferred first 3-dimension value during a third clock cycle, and configured to store the variable bit vector during a fourth clock cycle;
    wherein the RLC comprises a 3-dimension value storing buffer, which stores the transferred first 3-dimension value in a location of the 3-dimension value storing buffer during given clock cycles, the location being related with an index corresponding to the transferred first 3-dimension value;
    wherein the given clock cycles corresponds to 4 clock cycles.
    wherein the RLC outputs a run-level-last signal which includes the first 3-dimension value, an index signal corresponding to the run-level-last signal, and a DC signal indicating whether the first 3-dimension value is a DC value, in order to transfer the first 3-dimension value, and receives an escape signal and an escape index signal from the VLC.

5. The coefficient variable length coder of claim 4, wherein the VLC is configured to obtain the variable bit vector by using a gate-type reference table corresponding to the first 3-dimension value.

6. The coefficient variable length coder of claim 5, wherein the VLC is configured to receive the run-level-last signal, the index signal and the DC signal from the RLC, and configured to output the escape signal and the escape index signal.

7. The coefficient variable length coder of claim 6, wherein the VLC is configured to activate the escape signal when the VLC cannot find the first 3-dimension value in a general reference table, configured to output the escape index signal including the index corresponding to the first 3-dimension value, and configured to process an escape operation.

8. The coefficient variable length coder of claim 7, wherein, when the escape signal is activated, the RLC is configured to receive second 3-dimension values from the 3-dimension value storing buffer by using the escape index signal, and configured to transfer the second 3-dimension values to the VLC, the second 3-dimension values being obtained when an escape operation is processed, and the escape operation being processed when the transferred first 3-dimension value is not found in the general reference table.

9. The coefficient variable length coder of claim 8, wherein the VLC comprises a pingpong buffer for accumulating the variable bit vector and for transferring the variable bit vector in a unit of a given number of bits to a memory.

10. A variable length coder for a video codec, the variable length coder performing four-stage pipeline operations, the variable length coder comprising:
    an internal memory for storing a motion vector and coefficient data;
    a macroblock information variable length coder configured to perform a variable length coding upon an information, and configured to transfer the coded information to the internal memory to be stored, the information including a macroblock type and a non-zero data existence;

a Direct Current (DC) value Differential Pulse Code Modulation (DPCM) coder configured to receive a first DC value of a first block from the internal memory, configured to perform a DPCM coding upon DC value differences between the first DC value and second DC values of second blocks surrounding the first block, and configured to transfer the DPCM coded result to the internal memory to be stored;

a motion vector DPCM variable coder configured to receive motion vectors from the internal memory to perform a first variable length coding upon motion vector differences, and configured to transfer the variable length coded result to the internal memory to be stored;

a coefficient variable length coder configured to receive the coefficient data from the internal memory, configured to perform a coefficient variable length coding upon the coefficient data, and configured to store the coefficient variable length coded data in the internal memory;

a Direct Memory Access (DMA) configured to transfer the coded data stored in the internal memory to an external memory; and a variable length coder controller configured to control the macroblock information variable length coder, the DC value DPCM coder, the motion vector DPCM variable length coder, the coefficient variable length coder and the DMA based on control signals, wherein the coefficient variable length coder includes:

a run length coder (RLC) configured to perform the run length coding upon the coefficient data received from the internal memory to obtain a first 3-dimension value including run data, level data and last data during a first clock cycle, and configured to transferring the first 3-dimension value during a second clock cycle; and a variable length coder (VLC) configured to obtain a variable bit vector based on the transferred first 3-dimension value during a third clock cycle, and configured to store the variable bit vector during a fourth clock cycle.

11. The variable length coder of claim 10, wherein the motion vector DPCM variable coder and the coefficient variable length coder operate in parallel.

12. The variable length coder of claim 11, wherein the RLC stores the first 3-dimension value in a location of the internal memory, the location corresponding to an index, during given clock cycles.

13. The variable length coder of claim 12, wherein the VLC is configured to activate the escape signal when the VLC cannot find the first 3-dimension value in a general reference table, and configured to output an escape index signal including the index corresponding to the first 3-dimension value.

14. The variable length coder claim 13, wherein, when the escape signal is activated, the RLC is configured to receive second 3-dimension values from the 3-dimension value storing buffer by using the escape index signal, and configured to transfer the second 3-dimension values to the VLC, the second 3-dimension values being obtained when an escape operation is processed, and the escape operation being processed when the transferred first 3-dimension value is not found in the general reference table.

15. The variable length coder for a video codec of claim 14, wherein the VLC comprises a pingpong buffer for accumulating the variable bit vectors and for transferring the variable bit vector in a unit of a given number of bits to the internal memory.

* * * * *